United States Patent
Nishimura et al.

(10) Patent No.: US 8,564,105 B2
(45) Date of Patent: Oct. 22, 2013

(54) PIN DIODE

(75) Inventors: Yoshikazu Nishimura, Osaka (JP);
Hirofumi Yamamoto, Osaka (JP);
Takeyoshi Uchino, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 0 days.

(21) Appl. No.: 13/520,361

(22) PCT Filed: Feb. 16, 2010

(86) PCT No.: PCT/JP2010/052286
§ 371 (c)(1),
(2), (4) Date: Jul. 30, 2012

(87) PCT Pub. No.: WO2011/101956
PCT Pub. Date: Aug. 25, 2011

(65) Prior Publication Data
US 2012/0299164 A1  Nov. 29, 2012

(30) Foreign Application Priority Data

Feb. 16, 2010  (JP) .................................. 2010-031380

(51) Int. Cl.
*H01L 31/075*  (2012.01)
*H01L 31/105*  (2006.01)
*H01L 31/117*  (2006.01)

(52) U.S. Cl.
USPC .................................. 257/656; 257/E29.336

(58) Field of Classification Search
USPC .......................................... 257/656, E29.336
See application file for complete search history.

(56) References Cited

U.S. PATENT DOCUMENTS

2012/0018846 A1*  1/2012  Baburske et al. ............. 257/587

FOREIGN PATENT DOCUMENTS

| JP | 01-095568 | 4/1989 |
| JP | 06-244405 | 9/1994 |
| JP | 07-221290 | 8/1995 |
| JP | 07-221326 | 8/1995 |
| JP | 10-022395 | 1/1998 |
| JP | 10-335679 | 12/1998 |
| JP | 11-040822 | 2/1999 |
| JP | 2000-022176 | 1/2000 |
| JP | 2002-203955 | 7/2002 |
| JP | 2002-246609 | 8/2002 |
| JP | 2002-270857 | 9/2002 |

(Continued)

OTHER PUBLICATIONS

U.S. Appl. No. 13/520,357, filed Jul. 3, 2012.

(Continued)

*Primary Examiner* — David S Blum
(74) *Attorney, Agent, or Firm* — Kilyk & Bowersox, P.L.L.C.

(57) ABSTRACT

A PIN diode having improved avalanche resistance is provided. The PIN diode includes: a semiconductor substrate 11 that includes an N$^+$ semiconductor layer 1, and an N$^-$ semiconductor layer 2; a P-type anode region 15 that is formed by selective impurity diffusion into an outer surface of the N$^-$ semiconductor layer 2; and an anode electrode 17 that is conducted to the anode region 15 through a contact region 17c in the anode region 15. The anode region 15 has a substantially rectangular outer edge of which four sides are adapted to be linear parts B2 and four vertices are adapted to be curved parts B1, and outside the contact region 17c, N-type non-diffusion corner regions 16 that extend along the curved parts B1 are respectively formed.

4 Claims, 11 Drawing Sheets

A2-A2 CROSS SECTIONAL VIEW

(56) References Cited

FOREIGN PATENT DOCUMENTS

| | | |
|---|---|---|
| JP | 2004-247456 | 9/2004 |
| JP | 2006-269633 | 10/2006 |
| JP | 2009-164486 | 7/2009 |

OTHER PUBLICATIONS

International Search Report issued by the Japanese Patent Office in corresponding International Patent Application No. PCT/US2010/052286 dated May 18, 2010 (2 pages).

* cited by examiner

A1-A1 CROSS SECTIONAL VIEW

A2-A2 CROSS SECTIONAL VIEW

CONVENTIONAL EXAMPLE

PIN DIODE

This application is a National Stage Application of PCT/JP2010/052286, filed Feb. 16, 2010, which claims the priority of Japanese Patent Application No. 2010-031380, which is incorporated herein by reference.

FIELD OF THE INVENTION

The present invention relates to a PIN (P Intrinsic N) diode, and more particularly to improvement of a PIN diode in order to improve avalanche resistance.

BACKGROUND ART

As a semiconductor rectifier element in which on one principal surface of a semiconductor substrate including an N-type semiconductor layer, a cathode electrode is formed, and on the other principal surface, a rectangular-shaped anode region including a P-type semiconductor is formed, there is a PIN diode. The PIN diode achieves good breakdown voltage characteristics with respect to a reverse bias in such a way that the N-type semiconductor layer includes an $N^+$ semiconductor layer and an $N^-$ semiconductor layer (intrinsic semiconductor layer) having lower impurity concentration than impurity concentration of the $N^+$ semiconductor layer, and the $N^-$ semiconductor layer having high resistance is present between the anode region and the $N^+$ semiconductor layer.

As a breakdown phenomenon that occurs when a reverse bias is applied, there is avalanche breakdown (electron avalanche breakdown). The avalanche breakdown occurs when a reverse bias exceeding a breakdown voltage (reverse breakdown voltage) is applied, and a temperature rise due to a large avalanche current flow may lead to thermal destruction of the element. It is known that a depletion layer that is generated in the $N^-$ semiconductor layer by applying a reverse bias is unlikely to extend in an end part of the anode region as compared with a central part of the anode region. That is, a thickness of the depletion layer is small in the end part of the anode region as compared with the central part, which is likely to give rise to electric field concentration, and therefore the above-described avalanche breakdown is likely to occur in the end part of the anode region. For this reason, there is proposed a technique that, by forming an annular P-type region surrounding the anode region, reduces the electric field concentration in the end part of the anode region to thereby improve avalanche resistance (see, for example, Patent Literatures 1 and 2).

FIG. 9 is a plan view illustrating a configuration example of a conventional PIN diode 100, in which an anode region 105 is surrounded by a plurality of FLRs104. FIG. 10 illustrates a cross section cut by an A10-A10 section line in FIG. 9. FIG. 11 is a cross-sectional view of the PIN diode without any FLR 104.

In the PIN diode 100, on one principal surface of a semiconductor substrate 101, a cathode electrode 110 is formed, and on the other principal surface, an anode region 105, two FLRs 104, and a stopper region 111 are formed. Each of the FLRs (Field Limiting Rings) 104 is an annular region that is formed along an outer edge of the anode region 105 and includes a P-type semiconductor, and referred to as a guard ring. The stopper region 111 is an annular region that is formed in a circumferential edge part of the semiconductor substrate 101 and includes an $N^+$ semiconductor.

On the anode region 105, an anode electrode 106 is formed, and from a circumferential edge part of the anode region 105 to the stopper region 111, an oxide film 103 is formed. The oxide film 103 is an insulating film having an annular region, and the anode electrode 106 is formed with overlapping with an inner edge part of the oxide film 103, whereas with overlapping with an outer edge part, an annular equipotential electrode 102 is formed. The semiconductor substrate 101 includes an $N^+$ semiconductor layer 101a and an $N^-$ semiconductor layer 101b, and by selectively diffusing P-type impurities from a surface of the $N^-$ semiconductor layer 101b, the anode region 105 and the FLRs 104 are formed.

In the case where the FLRs 104 are not provided, a depletion layer 112 formed by applying a reverse bias is tabular (planar plane) in a central part of the anode region 105, whereas in an end part B11 of the anode region 105, the depletion layer 112 is cylindrical. For this reason, in particular, in the end part B11 of a curved part B10, electric field concentration occurs, and thereby avalanche breakdown is likely to occur. On the other hand, in the case where the FLRs 104 are provided, the depletion layer 112 extends from the end part B11 of the anode region 105 toward an outer edge of the semiconductor substrate 101. That is, the depletion layer 112 extending from the end part B11 of the anode region 105 reaches the FLRs 104, and further extends toward the outside from there, and thereby an electric field in the end part B11 of the anode region 105 is reduced. Also, each of the FLRs 104 is electrically isolated from the anode region 105 or the other FLR 104, and therefore between the anode region 105 and the FLR 104, or between the FLRs 104, a voltage drop occurs toward the outside, so that in the FLR 104 parts, electric field concentration is unlikely to occur.

In general, when a surge voltage generated by an external cause such as an inductive load or leakage inductance due to primary-secondary coupling of a transformer exceeds a breakdown voltage, an avalanche current flows in an element. At this time, avalanche breakdown occurs from a location where an electric field is most concentrated in the element. For this reason, in the above-described PIN diode 100, the electric field concentration occurs in the curved part B10 at the outer edge of the anode region 105, and avalanche current flows to easily give rise to thermal destruction, so that there is a limitation in improving avalanche resistance.

According to a conventional technique search by the present inventors, it turns out that as a technique that improves avalanche resistance of a semiconductor device, there are: (1) a method that increases a P-type impurity diffusion depth; (2) a method that controls impurity concentration by multiple diffusion or ion implantation (e.g., Patent Literatures 1 and 3 to 9); (3) a method that forms a highly resistive film on a chip surface (e.g., Patent Literatures 2 and 10); and (4) a method that, outside an anode region, forms a plurality of annular regions having low impurity concentration (e.g., Patent Literature 1). The method (1) is one that, by increasing the diffusion depth at the time of diffusing P-type impurities to form an anode region, reduces electric field concentration in an end part of the anode region, but cannot prevent an electric field from being concentrated in a curved part of the anode region. Also, to increase the diffusion depth, time necessary for a diffusion process is increased, which gives rise to a problem of reducing productivity.

The method (2) is one that, by implanting ions that can serve as N-type impurities, such as phosphorous, arsenic, or antimony, into a surface part of a high concentration P layer to the extent of not exceeding P-type impurity concentration, or directly performing ion implantation of P-type impurities at low concentration, forms a highly resistive layer having reduced impurity concentration in an end part of an anode region, and the presence of the highly resistive layer prevents avalanche current from being attracted to a surface layer. This method cannot be also prevent an electric field from being concentrated in a curved part of the anode region, and requires an ion implantation process, which gives rise to a problem of reducing productivity. The method (3) is one in which an anode electrode is configured to have a plurality of electrodes that are mutually separated, and a connection between the electrodes is made by a highly resistive film, and a larger voltage drop at an outer electrode is used to reduce electric field concentration in an end part of an anode region. This method cannot be also prevent an electric field from being concentrated in a curved part of the anode region, and requires complicated patterning for forming the plurality of electrodes and also a process of forming the highly resistive film, and therefore there arises a problem of reducing productivity.

The method (4) is one that, outside the anode region, forms the plurality of annular regions having low impurity concentration such that the plurality of annular regions overlap with each other in a surface part of a P layer, and thereby forms a resistive layer in an end part of the anode region. In this method, if avalanche breakdown occurs in a curved part of the anode region, avalanche current linearly flows toward an anode electrode through the resistive layer. At this time, the avalanche current flows with spreading, so that a sufficient voltage drop cannot be obtained, and therefore the avalanche breakdown continuously occurs at the same location. For this reason, the method (4) cannot prevent the curved part of the anode region from being thermally destroyed by the avalanche current. Also, this method requires an ion implantation process for forming the annular regions having low concentration, and therefore there arises a problem of reducing productivity. Further, in the method (4), in the case of, in the curved part of the anode region, attempting to increase a resistance component in a direction toward the outside, more annular regions should be formed, and therefore there arises a problem of decreasing an effective chip area.

Conventional Technique Document

Patent Literature

Patent Literature 1: JPA 2002-270857
Patent Literature 2: JPA 2000-22176
Patent Literature 3: JPA 2009-164486
Patent Literature 4: JPA 2004-247456
Patent Literature 5: JPA 2002-246609
Patent Literature 6: JPA 2002-203955
Patent Literature 7: JPA H10-335679
Patent Literature 8: JPA H07-221326
Patent Literature 9: JPA H07-221290
Patent Literature 10: JPA H11-040822

DISCLOSURE OF THE INVENTION

Problems to be Solved by the Invention

The present invention is made in consideration of the above situations, and an object thereof is to improve avalanche resistance of a PIN diode. In particular, an object of the present invention is to suppress thermal destruction from occurring due to current concentration on a curved part of an anode region at the time of applying a reverse bias exceeding a breakdown voltage. Also, an object of the present invention is to suppress the thermal destruction from occurring due to current concentration on one point in a linear part of the anode region at the time of applying the reverse bias exceeding the breakdown voltage. Further, an object of the present invention is to improve the avalanche resistance of the PIN diode without complicating a manufacturing process.

Means Adapted to Solve the Problems

A PIN diode according to a first aspect of the present invention is provided with: a semiconductor substrate that includes an N-type first semiconductor layer, and an N-type second semiconductor layer having lower impurity concentration than impurity concentration of the first semiconductor layer; a cathode electrode that is formed on an outer surface of the first semiconductor layer; a P-type anode region that is formed by selective impurity diffusion into an outer surface of the second semiconductor layer; and an anode electrode that is conducted to the anode region through a contact region in the anode region, wherein the anode region has a substantially rectangular outer edge of which four sides are adapted to be linear parts and four vertices are adapted to be substantially arc-like curved parts, and outside the contact region, N-type non-diffusion corner regions that extend along the curved parts are respectively formed.

If a reverse bias exceeding a breakdown voltage is applied to the PIN diode, avalanche breakdown occurs in any of the curved parts of the anode region, where electric filed concentration is likely to occur, and avalanche current flows from a location of the breakdown in the curved part to the anode electrode. Accordingly, by as in the above configuration, outside the contact region, forming the non-diffusion corner regions that extend along the curved parts, the avalanche current flows around a corresponding one of the highly resistive non-diffusion corner regions to flow in the anode region toward the contact region. That is, through a path placed between a corresponding one of the curved parts of the anode region and the non-diffusion corner region, the avalanche current flows. At this time, a voltage drop depending on a resistance component of the path occurs along an outer edge of the anode region to increase a potential at a location of the breakdown, and thereby the breakdown location moves toward a corresponding one of the linear parts having lower potential. That is, by moving the location of the breakdown occurring in the curved part of the anode region toward the linear part side along the outer edge of the anode region, the current can be suppressed from being concentrated on one point of the curved part to give rise to thermal destruction.

A PIN diode according to a second aspect of the present invention is, in addition to the above configuration, configured such that in the anode region, outside the contact region, N-type non-diffusion side regions that extend along the linear parts are formed.

According to such a configuration, after the movement of the breakdown location from the curved part to the linear part of the anode region, part of the avalanche current flows around a corresponding one of the highly resistive non-diffusion side regions to flow in the anode region toward the contact region. That is, through a path placed between the linear part of the anode region and the non-diffusion side region, the avalanche current flows. At this time, a voltage drop depending on a resistance component of the path occurs along the outer edge of the anode region to increase a potential at the new breakdown location in the linear part, and thereby the breakdown location moves to a lower potential site in the linear part. That is, by further moving the breakdown location, which was moved from the curved part to the linear part of the anode region, along the outer edge of the anode region, the current can be suppressed from being concentrated on one point of the linear part to give rise to thermal destruction.

A PIN diode according to a third aspect of the present invention is, in addition to the above configuration, configured such that in the anode region, two or more the non-diffusion side regions that intermittently extend along each of the linear parts are formed. According to such a configuration, after the movement of the breakdown location from the curved part to the linear part of the anode region, the current can be suppressed from being concentrated on one point of the linear part to give rise to thermal destruction.

A PIN diode according to a fourth aspect of the present invention is, in addition to the above configuration, configured such that the non-diffusion corner regions and the non-diffusion side regions are formed simultaneously with the anode region by the impurity diffusion in such a way as to, with use of a photomask for forming the anode region, mask the outer surface of the second semiconductor layer.

According to such a configuration, the N-type non-diffusion corner regions and non-diffusion side regions can be easily formed in the P-type anode region to improve productivity. That is, the anode region, non-diffusion corner regions, and non-diffusion side regions can be simultaneously formed by one impurity diffusion process in such a way as to use the one photomask to mask the outer surface of the second semiconductor layer and diffuse P-type impurities. Accordingly, the multiple diffusion or ion implantation process as in the above-described conventional technique is not separately required, and therefore as compared with a conventional element, without reducing productivity, the avalanche resistance can be improved at low cost.

Effects of the Invention

According to the PIN diode according to the present invention, at the time of the avalanche breakdown, by moving the location of the breakdown occurring in the curved part of the anode region to the linear part side, the current can be suppressed from being concentrated on one point of the curved part to give rise to thermal destruction.

Also, according to the PIN diode according to the present invention, by further moving the breakdown location, which was moved from the curved part to the linear part at the time of the avalanche breakdown, along the outer edge of the anode region, the current can be suppressed from being concentrated on one point of the linear part to give rise to thermal destruction.

Further, according to the PIN diode according to the present invention, the non-diffusion corner regions and non-diffusion side regions are simultaneously formed by the impurity diffusion process for forming the anode region, and thereby without reducing productivity, the avalanche resistance can be improved.

BEST MODE FOR CARRYING OUT THE INVENTION

First Embodiment
<Planar Layout of PIN Diode>

Figure 1:
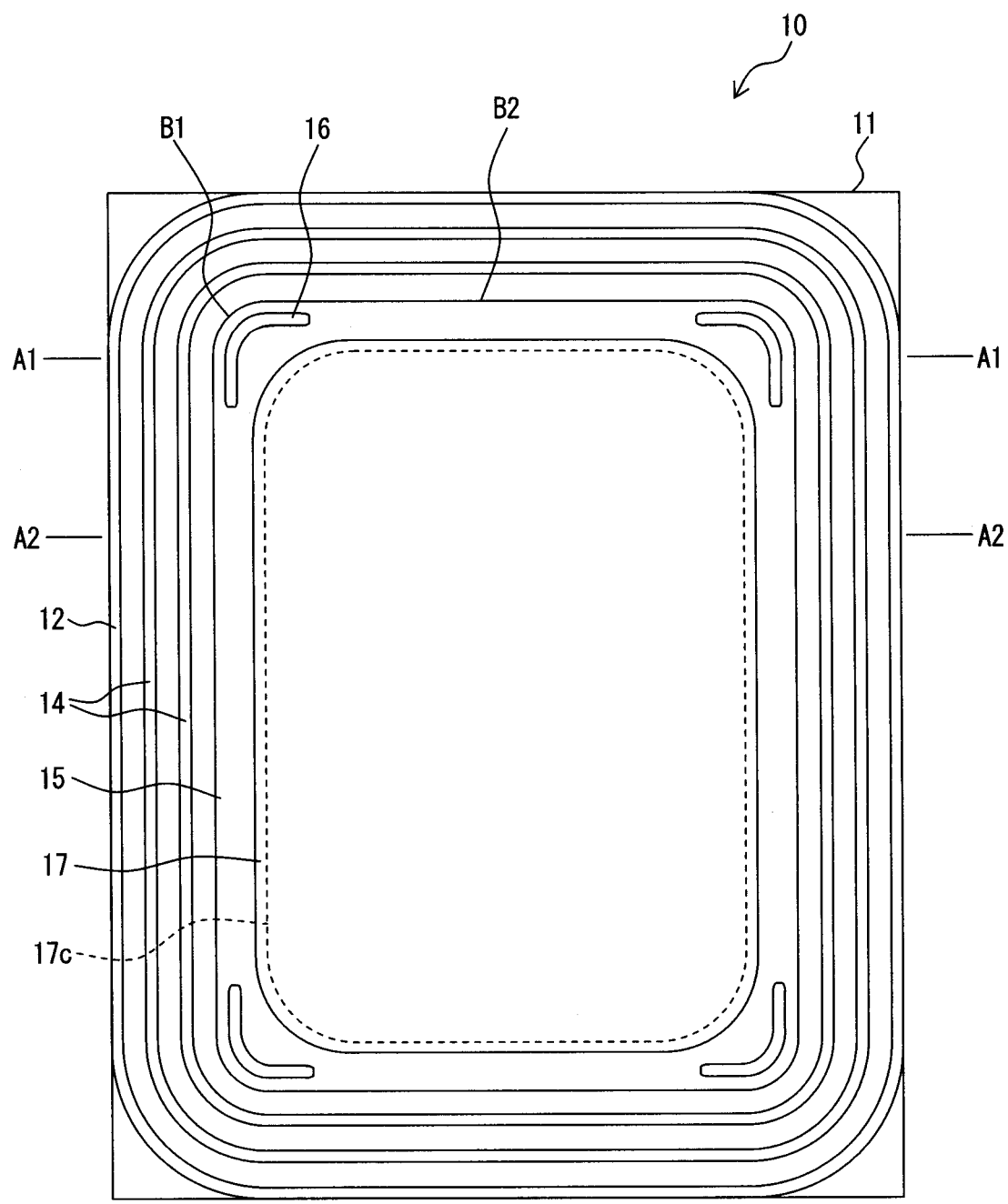
FIG. 1 is a plan view illustrating a configuration example of a PIN diode according to a first embodiment of the present invention.

FIG. 1 is a plan view illustrating a configuration example of a PIN diode according to a first embodiment of the present invention. A PIN diode 10 is a semiconductor rectifier element including respective semiconductor layers of P-I-N, and for examples, as an FRD (Fast Recovery Diode), used for a power converter or the like.

In the PIN diode 10, by selectively diffusing P-type impurities into one principal surface of an N-type semiconductor substrate 11, two FLRs 14 and an anode region 15 are formed. Also, on the one principal surface of the semiconductor substrate 11, a substantially rectangular anode electrode 17 and an annular equipotential electrode 12 are formed through an unillustrated insulating film.

The anode region 15 is a region made of a P-type semiconductor, and has a substantially rectangular outer edge of which four sides are adapted to be linear parts B2 and four vertices are adapted to be substantially arc-like curved parts B1. Each of the FLRs 14 is an annular breakdown voltage holding region that is formed along the outer edge of the anode region 15 and made of a P-type semiconductor.

The anode electrode 17 is formed on the anode region 15 through an oxide film, and conducted to the anode region 15 through a contact region 17c in the anode region 15. Also, in the anode region 15 on an outer side of the contact region 17c, non-diffusion corner regions 16 are formed. Each of the non-diffusion corner regions 16 is an N-type (N$^-$) semiconductor region formed in the anode region 15; formed between a corresponding one of the curved parts B1 of the anode region 15 and the contact region 17c; and adapted to have an elongated shape extending along the outer edge of the anode region 15.

<Cross-Sectional Structure>

Figure 2:
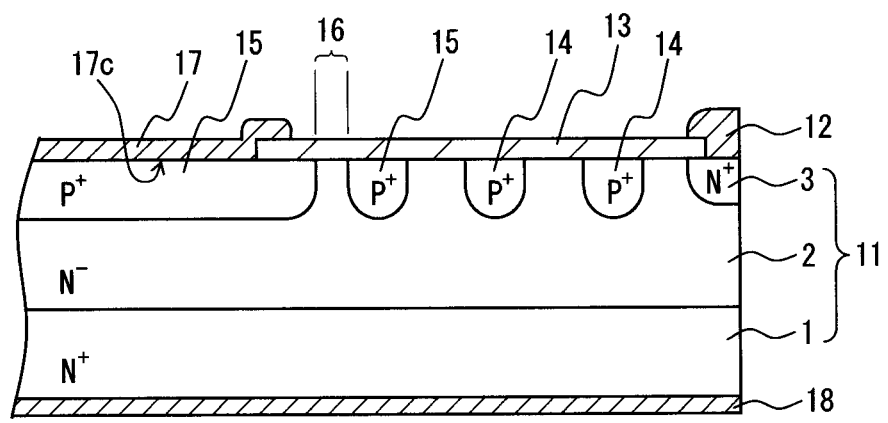
FIG. 2 is a cross-sectional view based on an A1-A1 section line in FIG. 1.
Figure 3:
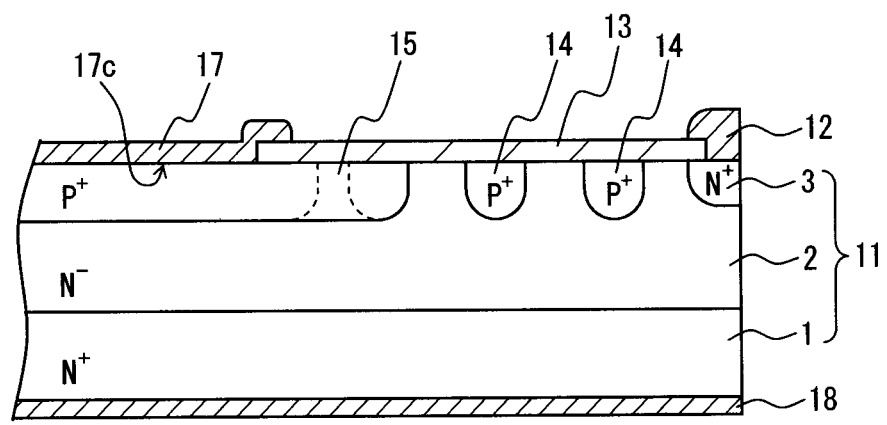
FIG. 3 is a cross-sectional view based on an A2-A2 section line in FIG. 1.

FIG. 2 is a cross-sectional view based on an A1-A1 section line in FIG. 1, in which a cross section including one of the non-diffusion corner regions 16 is illustrated. Also, FIG. 3 is a cross-sectional view based on an A2-A2 section line in FIG. 1, in which a cross section not including any of the non-diffusion corner regions 16 is illustrated.

The semiconductor substrate 11 includes an N$^+$ semiconductor layer 1 and an N$^-$ semiconductor layer 2, and is obtained by, for example, epitaxially growing the N$^-$ semiconductor layer 2 on the N$^+$ semiconductor layer 1. On the upper surface of the semiconductor substrate 11, i.e., on an outer surface of the N$^-$ semiconductor layer 2, the equipotential electrode 12 and anode electrode 17 are formed, and on a lower surface of the semiconductor substrate 11, i.e., on an outer surface of the $N^+$ semiconductor layer 1, a cathode electrode 18 is formed.

The anode region 15 and FLRs 14 are formed by selectively diffusing P-type impurities into the outer surface of the $N^-$ semiconductor layer 2. A stopper region 3 is an annular region that is formed in a circumferential edge part of the semiconductor substrate 11 and made of an $N^+$ semiconductor. Note that the $N^-$ semiconductor layer 2 is a semiconductor layer of which impurity concentration is sufficiently low as compared with the $N^+$ semiconductor layer 1 or anode region 15.

The anode electrode 17 is conducted to the anode region 15 through an opening of the oxide film 13. The contact region 17c is the opening of the oxide film 13, which is formed in the anode region 15, and through the contact region 17c, the anode electrode 17 and the anode region 15 are conducted to each other. In the same manner, the equipotential electrode 12 is also conducted to the stopper region 3 through an opening of the oxide film 13. That is, the oxide film 13 is formed in an annular region from the anode region 15 to the stopper region 3; the anode electrode 17 is formed with a part thereof overlapping with an inner edge part of the oxide film 13; and the equipotential electrode 12 is also formed with a part thereof overlapping with an outer edge part of the oxide film 13.

The non-diffusion corner region 16 is an $N^-$ semiconductor layer 2 formed in the anode region 15, and formed simultaneously with the anode region 15 by masking the outer surface of the $N^-$ semiconductor layer 2 at the time of the impurity diffusion. That is, the FLRs 14, anode region 15, and non-diffusion corner region 16 are simultaneously formed by one impurity diffusion process in such a way as to use one photomask to mask the outer surface of the $N^-$ semiconductor layer 2 and diffuse the P-type impurities. Accordingly, the multiple diffusion or ion implantation process as in the above-described conventional technique is not required, and therefore productivity is not reduced.

<Curved Part B1 of Anode Region>

Figure 4:
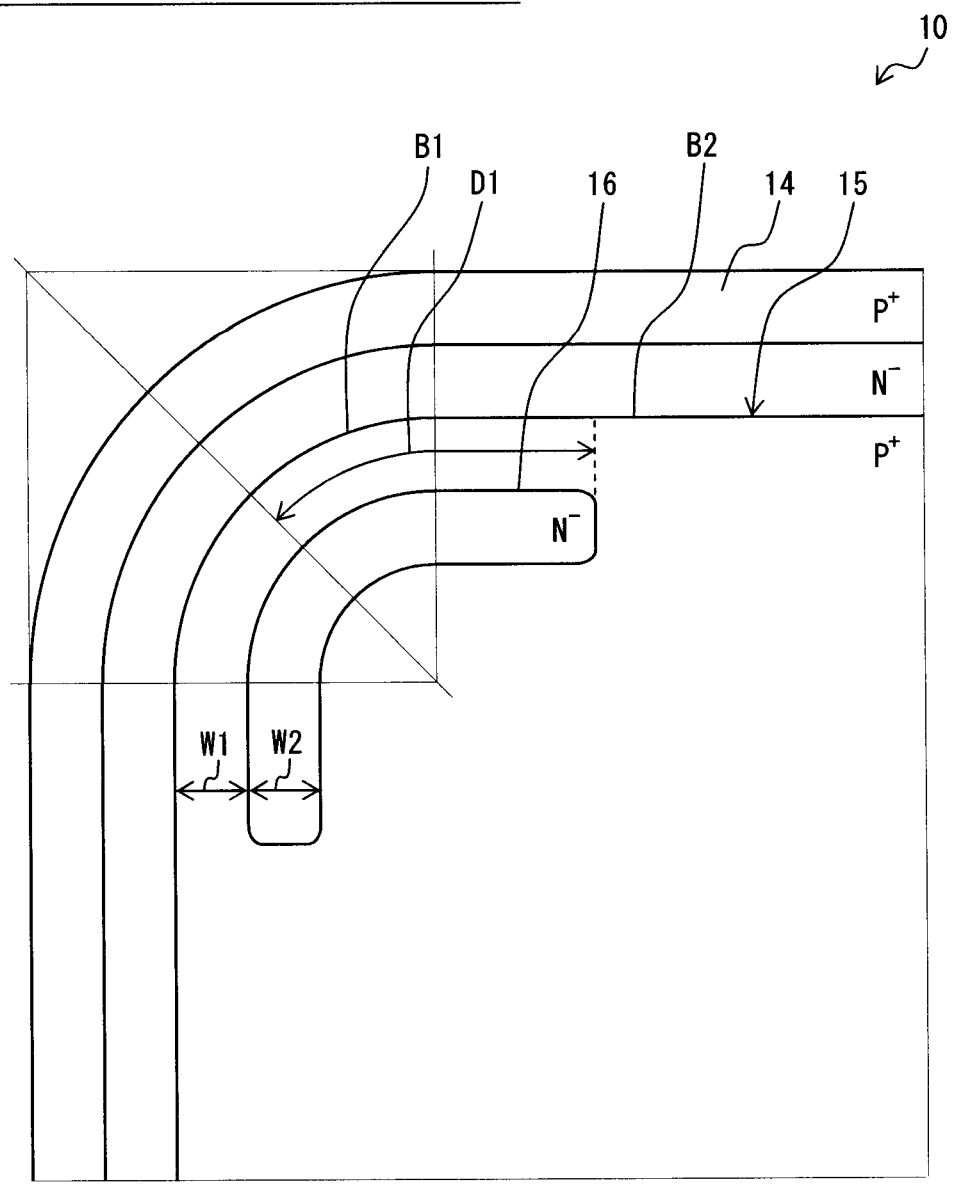
FIG. 4 is an enlarged view illustrating an enlarged main part of the PIN diode 10 in FIG. 1.

FIG. 4 is an enlarged view illustrating an enlarged main part of the PIN diode 10 in FIG. 1, in which one of the curved parts B1 of the anode region 15 and its periphery are illustrated with the oxide film 13 and anode electrode 17 being omitted. The anode region 15 is adapted to have the substantially rectangular shape of which the respective vertices are chamfered, and also adapted to have the four curved parts B1 corresponding to the vertices and the linear parts B2 corresponding to the four sides. By forming the respective vertices of the anode region 15 into the substantially arc-like curved parts B1, electric field concentration on any of the vertices can be suppressed.

Each of the non-diffusion corner regions 16 is an elongated region having a substantially uniform width, which is formed inside a corresponding one of the curved parts B1 of the anode region 15, and extends along the outer edge of the anode region 15, and outside the non-diffusion corner region 16, an elongated anode region 15 that serves as a avalanche current path and has a substantially uniform width is formed. Here, the non-diffusion corner region 15 is adapted to have a shape that, through an inside of the curved part B1, extends from an inside of one of two linear parts B2 between which the curved part B1 is placed to an inside of the other linear part B2.

A length D1 of the non-diffusion corner region 16 is sufficiently long as compared with a width W2 of it, and determined depending on a resistance value required for the current path. That is, the length D1 is determined such that the resistance value enables a breakdown location in the curved part B1 to be moved to any of the linear parts B2 by a voltage drop due to avalanche current. For example, assuming that a width W1 from the non-diffusion corner region 16 to the outer edge of the anode region 15 is W1=10 μm; the width W2 of the non-diffusion corner region 16 is W2=10 μm; and the resistance value of the current path along the anode region 15 is 2 kΩ the length D1 from the center of the curved part B1 to one end of the non-diffusion corner region 16 is set as D1=approximately 100 μm, which is sufficiently long.

<Avalanche Breakdown in Curved Part B1>

Figure 5:
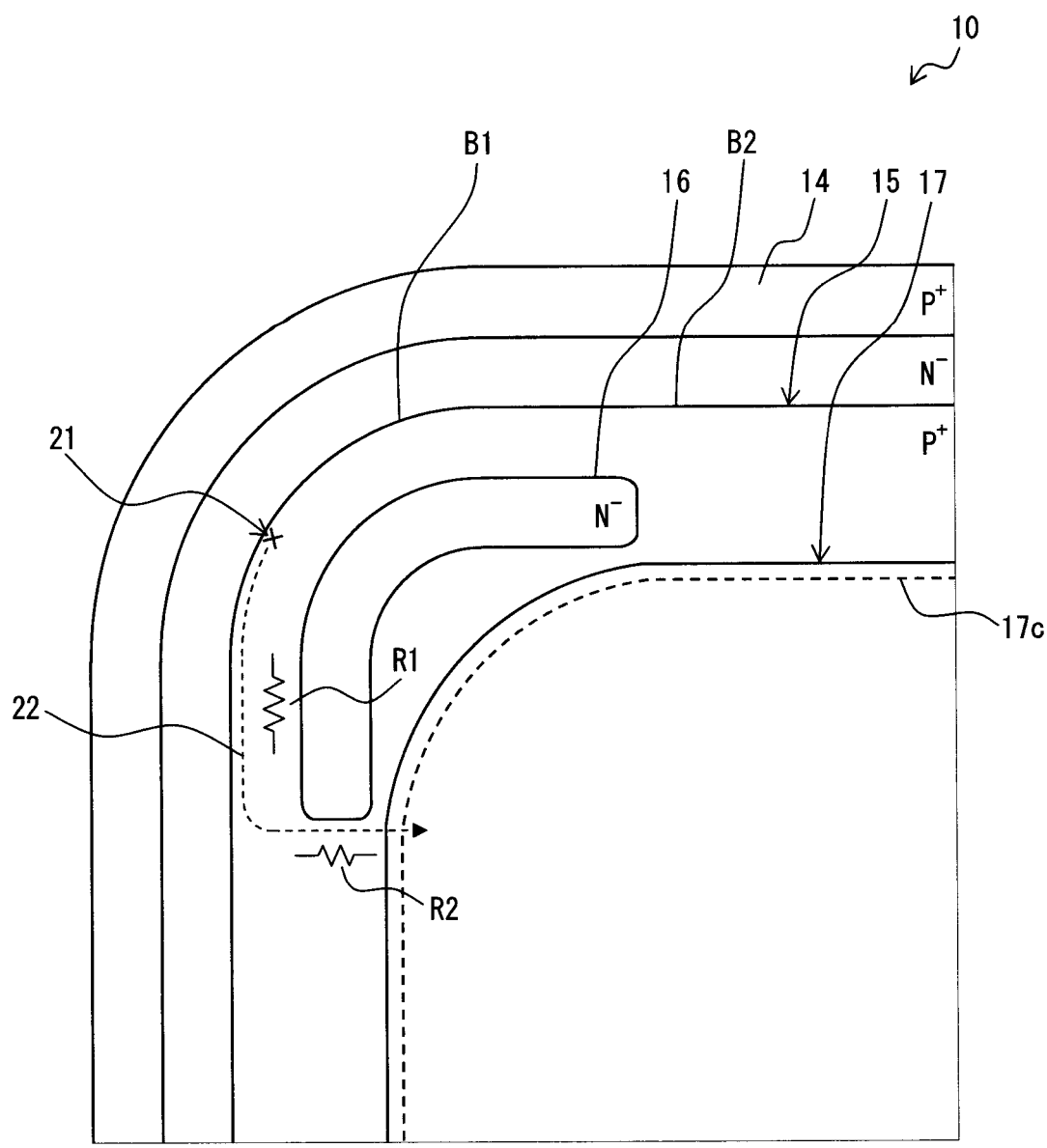
FIG. 5 is an explanatory diagram schematically illustrating an example of operation of the PIN diode 10 in FIG. 1.

FIG. 5 is an explanatory diagram schematically illustrating an example of operation of the PIN diode 10 in FIG. 1, in which the current path for the case where the avalanche breakdown occurs in the curved part B1 of the anode region 15 is illustrated.

In general, the avalanche breakdown occurs from a location where an electric field is most concentrated in an element. In the case of the PIN diode 10 of which the anode region 15 is adapted to be substantially rectangular, electric field concentration is largest in any of the curved parts B1 of the anode region 15; second largest in any of the linear parts B2; and small inside the anode region 15 as compared with the outer edge of the anode region 15. For this reason, in the PIN diode 10, first avalanche breakdown occurs near any of the curved parts B1 of the anode region 15.

Meanwhile, on the shortest path from each of the curved parts B1 of the anode region 15 to the contact region 17c, a corresponding one of the highly resistive non-diffusion corner regions 16 including the low impurity concentration $N^-$ semiconductor layer 2 is formed. For this reason, if near the curved part B1 of the anode region 15, the avalanche breakdown occurs, avalanche current 22 cannot flow through the shortest path from a location 21 of the breakdown to the contact region 17c, but flows along the outer edge of the anode region 15 so as to flow around the outside of the non-diffusion corner region 16.

The avalanche current 22 flows through such a path, and thereby a voltage drop occurs due to a resistance component (R1+R2) of the path. For this reason, a potential at the breakdown location 21 is increased, and the breakdown location 21 moves to any of the linear part B2 sides having a lower potential. As a result, if a sufficient voltage drop occurs, the breakdown location moves to near the linear part B2 of the anode region 15. The breakdown location 21 moves in this manner, so that the location where temperature is raised by the flow of the avalanche current 22 is distributed, and thereby the occurrence of thermal destruction of the element can be suppressed.

<Method for Manufacturing PIN Diode 10>

Next, an outline of a method for manufacturing such a PIN diode 10 is described. The $N^-$ semiconductor layer 2 of the semiconductor substrate 11 is formed by epitaxially growing an N-type semiconductor layer having low impurity concentration on the $N^+$ semiconductor layer 1 containing N-type impurities such as phosphorous (P), arsenic (As), or antimony (Sb). Note that the semiconductor substrate 11 may be one that is prepared by diffusing N-type impurities into the $N^-$ semiconductor layer 2 to form the $N^+$ semiconductor layer 1.

The anode region 15, non-diffusion corner regions 16, and FLRs 14 are simultaneously formed by the one impurity diffusion process in such a way as to use the one photomask to pattern a resist film and diffuse the P-type impurities. That is, the resist film including photoresist is formed on the semiconductor substrate 11, and with use of the common photomask, the resist film is exposed and developed to be thereby patterned. The anode region 15, non-diffusion corner regions 16, and FLRs 14 are then formed by diffusing P-type impurities such as boron (B) or indium (In) from the surface of the semiconductor substrate 11. Accordingly, the multiple diffusion or ion implantation process as in the above-described conventional technique is not required, and therefore without reducing productivity, avalanche resistance can be improved at low cost.

The cathode electrode 18 or anode electrode 17 is formed by, for example, on a corresponding surface of the semiconductor substrate 11, evaporating electrically conductive metal and using a resist pattern to selectively remove the evaporated metal film.

According to the present embodiment, if the avalanche breakdown occurs in the curved part B1 of the anode region 15, the avalanche current flows outside the non-diffusion corner region 16 along the outer edge of the anode region 15, and flows around the non-diffusion corner region 16. For this reason, a potential at a location of the breakdown is increased by a resistance component of a current path on an outer side of the non-diffusion corner region 16, and therefore the breakdown location moves to a lower potential side. The breakdown location moves in this manner, so that the location where the avalanche current flows with being concentrated and thereby temperature is raised is distributed, and therefore the occurrence of thermal destruction of the element can be suppressed. Accordingly, the occurrence of the thermal breakdown by the avalanche current in the curved part B1 of the anode region 15 can be suppressed to improve the avalanche resistance.

Further, at the time of patterning the resist film for electively diffusing the impurities, the common photomask can be used to form the anode region 15, non-diffusion corner regions 16, and FLRs 14, and therefore productivity can be improved. That is, the anode region 15, non-diffusion corner regions 16, and plurality of FLRs 14 can be simultaneously formed by the one impurity diffusion process in such a way as to use the one photomask to pattern the resist film and then diffuse the P-type impurities. Accordingly, the multiple diffusion or ion implantation process as in the above-described conventional technique is not required, and therefore as compared with a conventional element, without reducing productivity, the avalanche resistance can be improved at low cost.

Second Embodiment

In the first embodiment, described is the example of the case where, for each of the curved parts B1 of the anode region 15, the non-diffusion corner region 16 including the N⁻ semiconductor layer 2 is formed. On the other hand, in the present embodiment, described is the case where for each of linear parts B2 of an anode region 15, a non-diffusion side region is formed on an inner side of the linear part B2.

Figure 6:
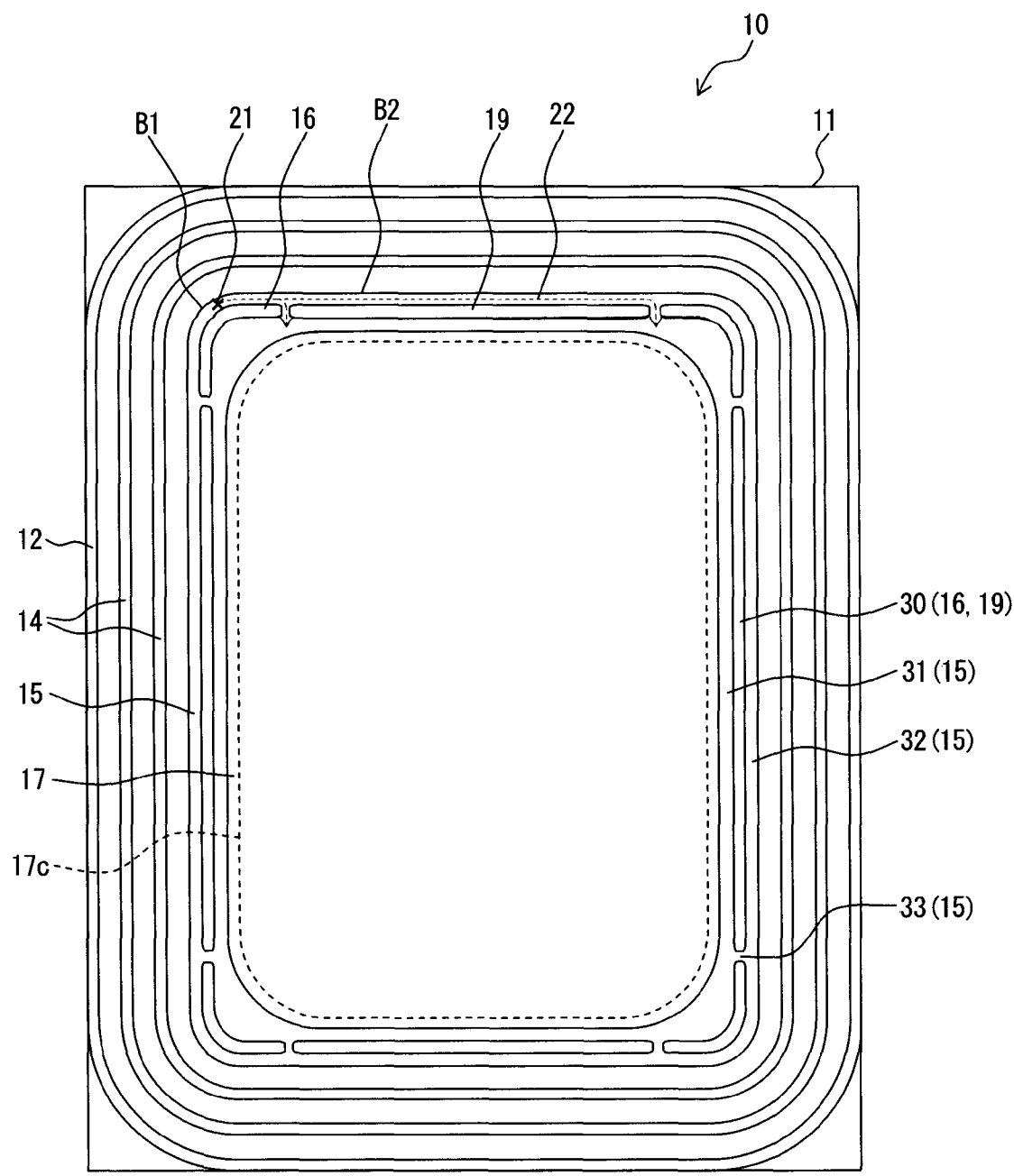
FIG. 6 is a plan view illustrating a configuration example of a PIN diode according to the second embodiment of the present invention.

FIG. 6 is a plan view illustrating a configuration example of a PIN diode according to the second embodiment of the present invention, in which a PIN diode 10 provided with non-diffusion corner regions 16 and the non-diffusion side regions 19 is illustrated. In the PIN diode 10, in an anode region 15 on an outer side of a contact region 17c, the non-diffusion corner regions 16 and non-diffusion side regions 19 are formed.

Each of the non-diffusion side regions 19 is a highly resistive N-type (N⁻) semiconductor region formed in the anode region 15; formed between a corresponding one of the linear parts B2 of the anode region 15 and the contact region 17c; and adapted to have an elongated shape that extends along an outer edge of the anode region 15. In addition, any of the non-diffusion corner regions 16 and any adjacent one of the non-diffusion side regions 19 are, between which the anode region 15 intervenes, formed without being connected to each other.

The non-diffusion corner regions 16 and non-diffusion side regions 19 are formed by, at the time of impurity diffusion, masking an outer surface of an N⁻ semiconductor layer 2 with a resist film. That is, the anode region 15, non-diffusion regions 16 and 19, and plurality of FLRs 14 can be simultaneously formed by one impurity diffusion process in such a way as to use one photomask to pattern the resist film, and diffuse P-type impurities. Accordingly, the multiple diffusion or ion implantation process as in the above-described conventional technique is not required, and therefore without reducing productivity, avalanche resistance can be improved.

Figure 7:
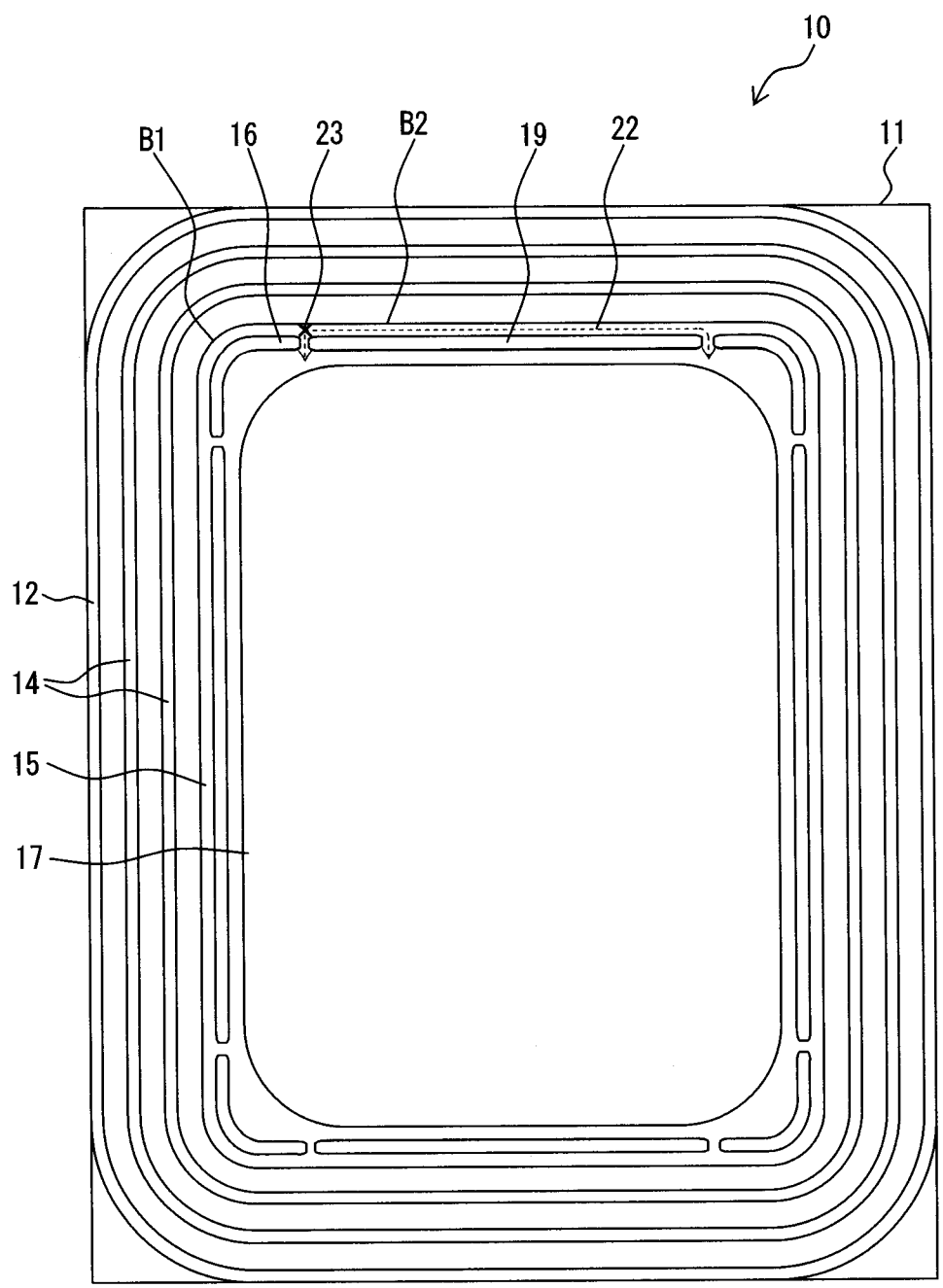
FIG. 7 is a diagram illustrating a current path for the case where, from a state illustrated in FIG. 6.

FIG. 7 is a diagram illustrating a current path for the case where, from a state illustrated in FIG. 6, a breakdown location moves to one of the linear parts B2 of the anode region 15. If the breakdown location moves from the curved part B1 of the anode region 15 to the linear part B2, part of avalanche current 22 flows around a corresponding one of non-diffusion side regions 19 and flows into an anode electrode 17.

The non-diffusion side region 19 is an elongated region having a substantially uniform width, which is formed inside the linear part B2 of the anode region 15, and extends along the outer edge of the anode region 5, and outside of the non-diffusion side region 19, an elongated anode region 15 having a substantially uniform width, which serves as the avalanche current path, is formed. The avalanche current flows through the path, so that a potential at the breakdown location 23 is increased by a voltage drop due to a resistance component of the path, and thereby the movement of the breakdown location 23 is repeated.

According to the present embodiment, in the case where the breakdown location is present in the curved part B1 of the anode region 15, the avalanche current flows around outside of the non-diffusion corner region 16, and the breakdown location 21 moves from the curved part B1 to the linear part B2 of the anode region 15. After the movement of the breakdown location to the linear part B2, the avalanche current flows along the outer edge of the anode region 15 so as to flow around the non-diffusion side region 19, and thereby the potential at the new breakdown location is increased. For this reason, the breakdown location can be moved along the linear part B2 of the anode region 15, and thereby effectively distributed.

Note that, in the PIN diode 10 in FIG. 6, the non-diffusion corner regions 16 and non-diffusion side regions 19 are arranged in line along the outer edge of the anode region 15, and between the outer edge of the anode region 15 and the contact region 17c, an intermittent annular non-diffusion region 30 is formed.

Assuming that the anode region 15 on an inner side of such an annular non-diffusion region 30 is referred to as a main anode region 31; the anode region 15 on an outer side is referred to as an annular anode region 32; and substantially rectangular anode regions 15 that connect the main anode region 31 and the annular anode region 32 to each other are referred to as anode connecting regions 33, it can also be said that the PIN diode 10 in FIG. 6 is configured such that, along a substantially rectangular outer edge of the main anode region 31 that has the outer edge of which four sides are adapted to be linear parts and four vertices are adapted to be curved parts, the annular anode region 32 is formed, and through the anode connecting regions 33, the linear parts of the main anode region 31 are connected to an inner edge of the annular anode region 32.

The anode connecting regions 33 are not connected to any of the curved parts of the outer edge of the main anode region 31. Also, a resistance value of each of the anode connecting regions 33 can be controlled by a width and length thereof. For this reason, preferably, widths and lengths of the respective anode connecting regions 33 are made to substantially coincide with one another to make resistance values of the respective anode connecting regions 33 substantially coincide with one another.

Figure 8:
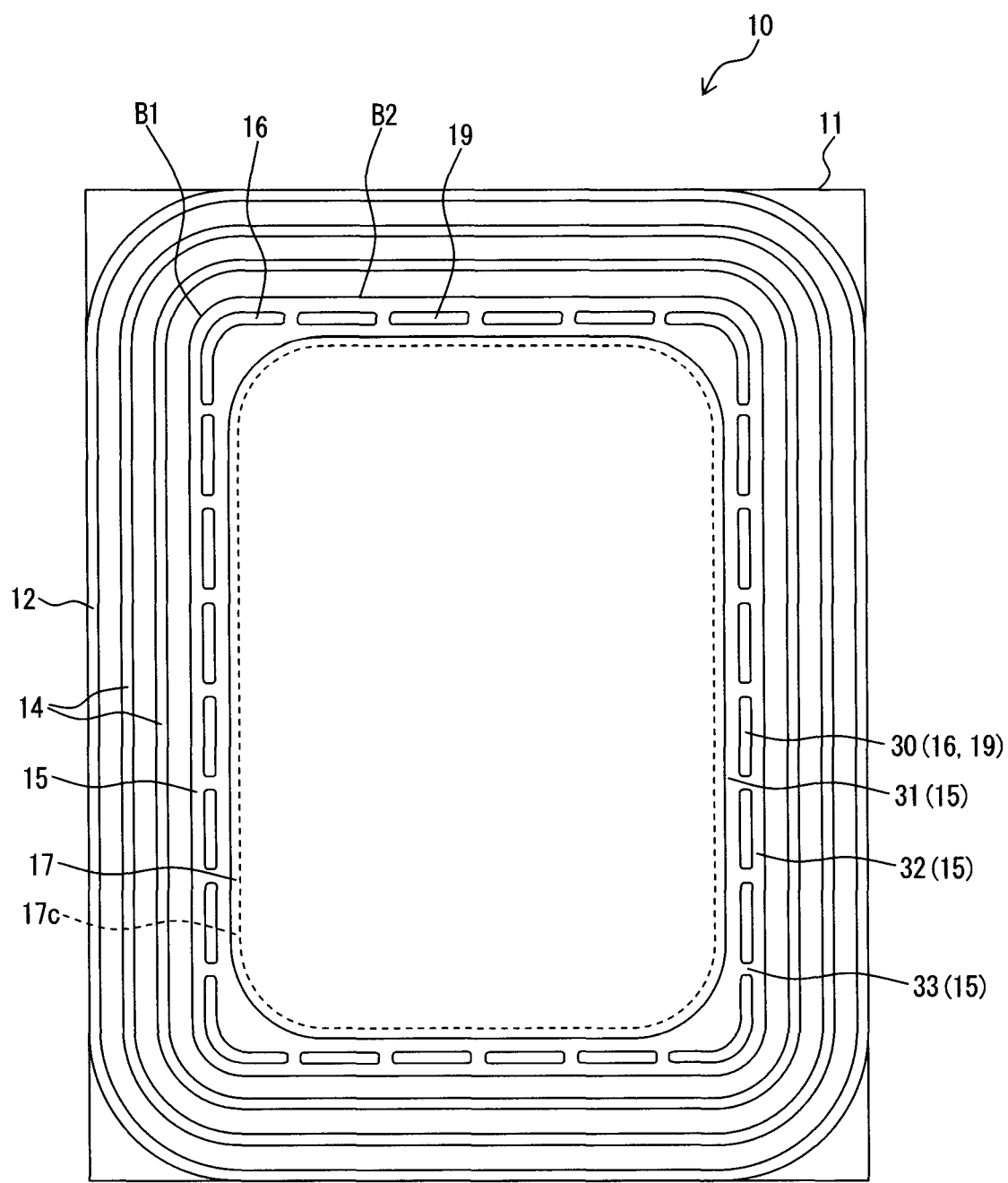
FIG. 8 is a plan view illustrating another configuration example of the PIN diode 10 according to the second embodiment of the present invention.
Figure 9:
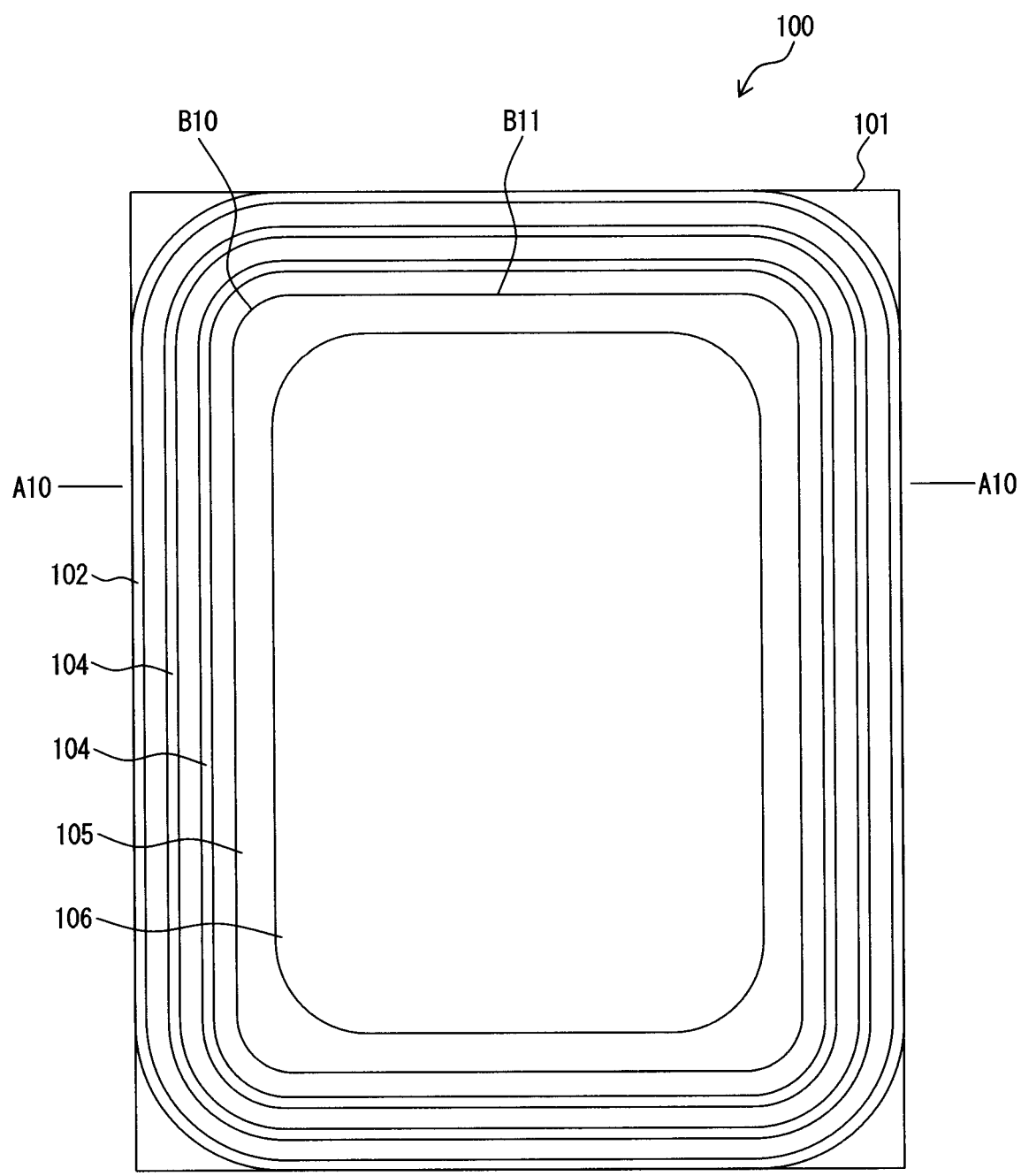
FIG. 9 is a plan view illustrating a configuration example of a conventional PIN diode 100.
Figure 10:
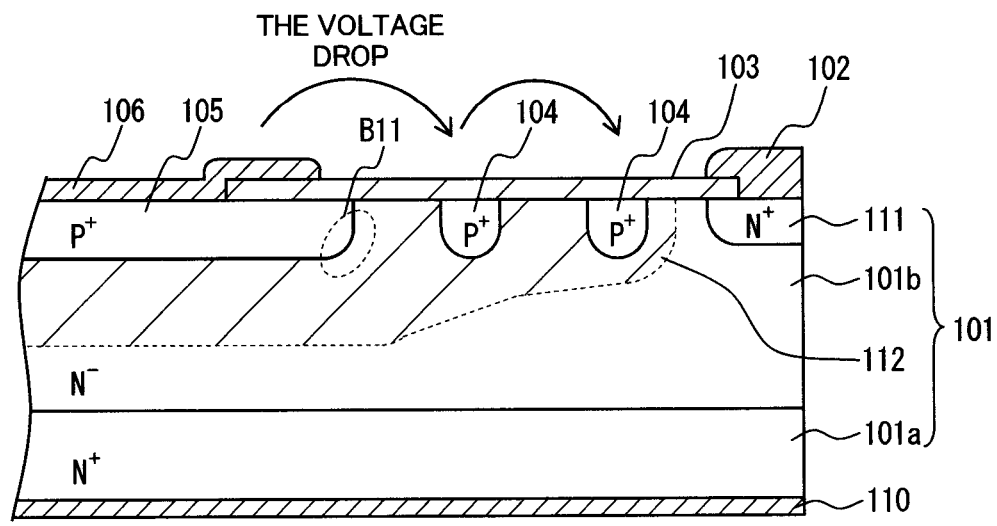
FIG. 10 illustrates a cross section cut by an A10-A10 section line in FIG. 9.
Figure 11:
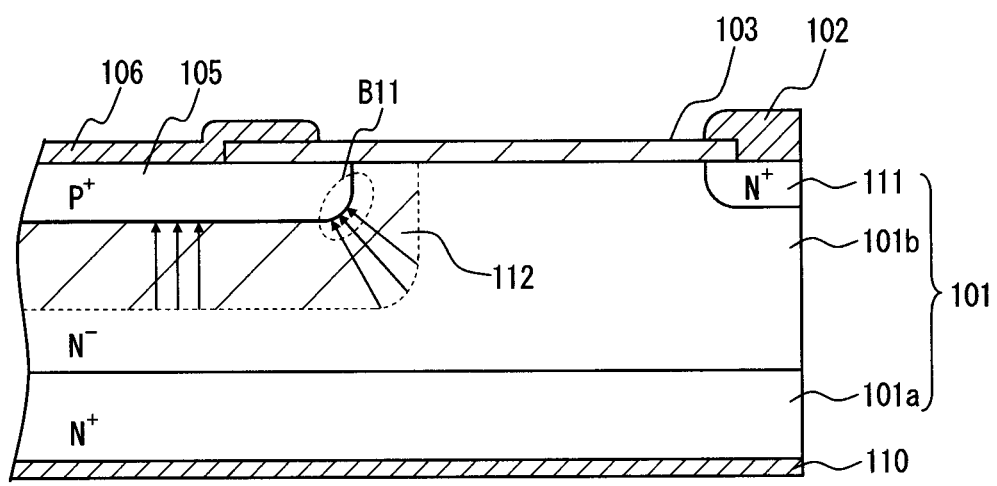
FIG. 11 is a cross-sectional view of the PIN diode without any FLR 104.

FIG. 8 is a plan view illustrating another configuration example of the PIN diode 10 according to the second embodiment of the present invention. As compared with the PIN diode 10 in FIG. 6, the PIN diode 10 in FIG. 8 is different in that two or more non-diffusion side regions 19 are formed for each of the linear parts B2 of the anode region 15.

In the PIN diode 10, in the anode region 15 on an outer side of the contact region 17c, the two or more non-diffusion side regions 19 that extend along one and the same linear part B2. For this reason, after the movement of the breakdown location from the curved part B1 to the linear part B2 of the anode region 15, the breakdown location 23 in the linear pat B2 is easily distributed. Accordingly, the occurrence of thermal destruction due to concentration of the current on one point of the linear part B2 can be suppressed.

In particular, by making length of the two or more non-diffusion side regions 19 formed along one and the same linear part B2 substantially coincide with each other to make resistance values of current paths on outer sides of the non-diffusion side regions 19 coincide with each other, the concentration of the current on one point in the linear part B2 can be further effectively suppressed.

In addition, it can also be said that the PIN diode 10 in FIG. 8 is, as in the case of FIG. 6, configured such that along the outer edge of the main anode region 31, the annular anode region 32 is formed, and the main anode region 31 and the annular anode region 32 are connected to each other through the anode connecting regions 33. However, in the case of FIG. 6, the anode connecting regions 33 formed in one and the same linear part B2 are formed in two locations between the non-diffusion corner regions 16 and the non-diffusion side region 19, whereas in the case of FIG. 8, the anode connecting regions 33 are formed in three or more locations that are added with a location between any adjacent non-diffusion side regions 19.

Note that, in the first and second embodiments, described is the example of the case where as an anode region 15 terminal structure, the plurality of FLRs 14 are formed; however, the present invention is not limited to this. For example, in order to increase a breakdown voltage, a SIPOS layer may be formed outside the anode region 15. The SIPOS (Semi-Insulating Polycrystalline Silicon) layer is a semi-insulating layer in which oxygen is mixed in polycrystalline silicon, and movable carriers inside the SIPOS layer compensate a disturbance in electric field distribution, so that the breakdown voltage can be improved. Alternatively, a technique that combines: an FP (Field Plate) technique that, by extending the anode electrode 17 toward an outer edge side of the semiconductor substrate 11 on the oxide film 13, improves a breakdown voltage in an end part of the anode region 15; and the FLR is also included in the present invention.

This application claims priority under the Paris Convention based on the following patent application in Japan: the patent application filed on Feb. 16, 2010 (Japanese patent application No. 2010-031380), the entire content of which is incorporated herein by reference.

Description of Reference Numerals

1 $N^+$ semiconductor layer
2 $N^-$ semiconductor layer
3 stopper region
10 PIN diode
11 semiconductor substrate
12 equipotential electrode
13 oxide film
14 FLR
15 anode region
16 non-diffusion corner region
17 anode electrode
17c contact region
18 cathode electrode
19 non-diffusion side region
B1 curved part of anode region
B2 linear part of anode region

What is claimed is:

1. A PIN diode comprising:
a semiconductor substrate that includes an N-type first semiconductor layer, and an N-type second semiconductor layer having lower impurity concentration than impurity concentration of the first semiconductor layer;
a cathode electrode that is formed on an outer surface of the first semiconductor layer;
a P-type anode region that is formed by selective impurity diffusion into an outer surface of the second semiconductor layer; and
an anode electrode that is conducted to said anode region through a contact region in said anode region, wherein
said anode region has a substantially rectangular outer edge of which four sides are adapted to be linear parts and four vertices are adapted to be substantially arc-like curved parts, and outside said contact region, N-type non-diffusion corner regions that extend along said curved parts are respectively formed.

2. The PIN diode according to claim 1, wherein
in said anode region, outside said contact region, N-type non-diffusion side regions that extend along said linear parts are formed.

3. The PIN diode according to claim 2, wherein
in said anode region, two or more said non-diffusion side regions that intermittently extend along each of said linear parts are formed.

4. The PIN diode according to claim 2, wherein
said non-diffusion corner regions and said non-diffusion side regions are formed simultaneously with said anode region by said impurity diffusion in such a way as to, with use of a photomask for forming said anode region, mask the outer surface of the second semiconductor layer.

* * * * *